United States Patent
Busani et al.

(10) Patent No.: US 12,255,265 B2
(45) Date of Patent: Mar. 18, 2025

(54) DEVICES COMPRISING DISTRIBUTED BRAGG REFLECTORS AND METHODS OF MAKING THE DEVICES

(71) Applicant: UNM RAINFOREST INNOVATIONS, Albuquerque, NM (US)

(72) Inventors: Tito Busani, Albuquerque, NM (US); Daniel Feezell, Albuquerque, NM (US); Mahmoud Behzadirad, Albuquerque, NM (US); Morteza Monavarian, Albuquerque, NM (US); Saadat Mishkat-Ul-Masabih, Albuquerque, NM (US)

(*) Notice: Subject to any disclaimer, the term of this patent is extended or adjusted under 35 U.S.C. 154(b) by 519 days.

(21) Appl. No.: 17/780,689

(22) PCT Filed: Nov. 27, 2020

(86) PCT No.: PCT/US2020/062510
§ 371 (c)(1),
(2) Date: May 27, 2022

(87) PCT Pub. No.: WO2021/108772
PCT Pub. Date: Jun. 3, 2021

(65) Prior Publication Data
US 2023/0011230 A1 Jan. 12, 2023

Related U.S. Application Data

(60) Provisional application No. 62/941,922, filed on Nov. 29, 2019.

(51) Int. Cl.
*H01L 33/10* (2010.01)
*H01L 33/00* (2010.01)
(Continued)

(52) U.S. Cl.
CPC ............ *H01L 33/10* (2013.01); *H01L 33/007* (2013.01); *H01L 33/025* (2013.01); *H01L 33/08* (2013.01);
(Continued)

(58) Field of Classification Search
CPC ............. H01L 21/02507; H01L 27/153; H01L 33/10; H01S 5/125
See application file for complete search history.

(56) References Cited

U.S. PATENT DOCUMENTS

2013/0175501 A1  7/2013  Hersee et al.
2017/0117438 A1  4/2017  Shur et al.
(Continued)

FOREIGN PATENT DOCUMENTS

EP  3211659 A1  8/2017

OTHER PUBLICATIONS

Search Report and Written Opinion dated Mar. 11, 2021 in corresponding International Application No. PCT/US2020/062510, 6 pages.

*Primary Examiner* — Jaehwan Oh
(74) *Attorney, Agent, or Firm* — MH2 Technology Law Group LLP

(57) ABSTRACT

A method for making a device. The method comprises forming a buffer layer on a substrate; forming a periodically doped layer on the buffer layer; forming one or more wires on the periodically doped layer, the wires being chosen from nanowires and microwires; and introducing porosity into the periodically doped layer to form a porous distributed Bragg reflector (DBR). Various devices that can be made by the method are also disclosed.

26 Claims, 8 Drawing Sheets

(51) Int. Cl.
    *H01L 33/02*     (2010.01)
    *H01L 33/08*     (2010.01)
    *H01L 33/12*     (2010.01)
    *H01L 33/18*     (2010.01)
    *H01L 33/24*     (2010.01)
    *H01S 5/125*     (2006.01)
    *H01S 5/34*     (2006.01)

(52) U.S. Cl.
    CPC ............... *H01L 33/12* (2013.01); *H01L 33/18* (2013.01); *H01L 33/24* (2013.01); *H01S 5/125* (2013.01); *H01S 5/341* (2013.01)

(56) References Cited

U.S. PATENT DOCUMENTS

2021/0126161 A1*   4/2021   Monavarian ........ H01L 33/0075
2022/0208848 A1*   6/2022   Tan ....................... H01L 21/306
2023/0317892 A1*  10/2023   Mezouari ................ H01L 33/10
                                                                                       257/79

* cited by examiner

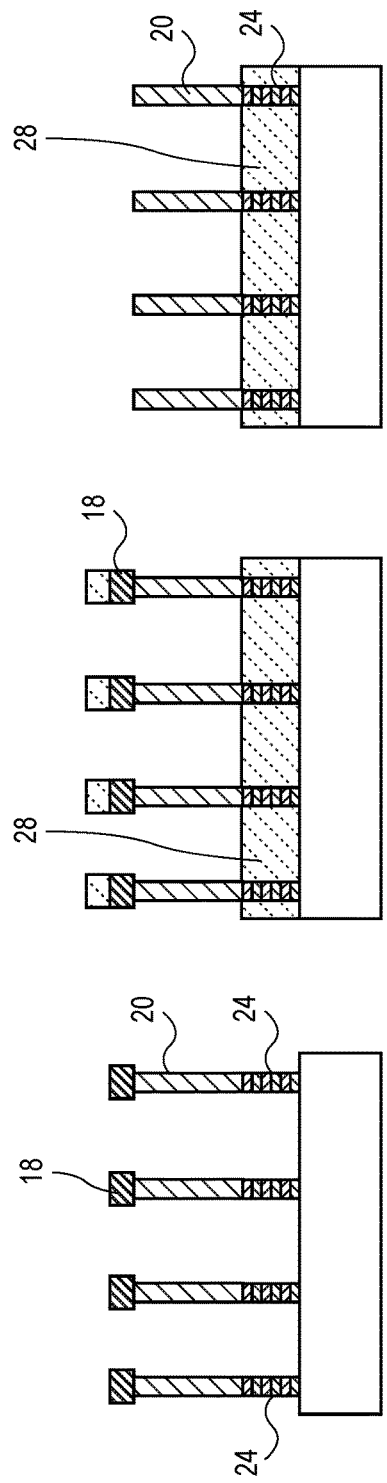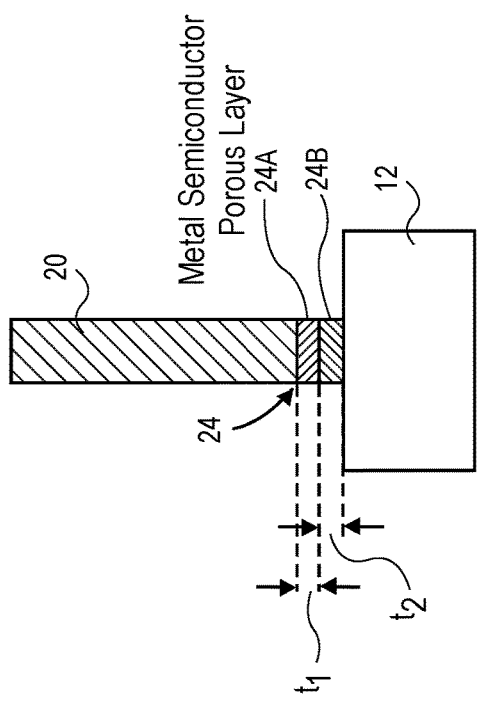

DEVICES COMPRISING DISTRIBUTED BRAGG REFLECTORS AND METHODS OF MAKING THE DEVICES

RELATED APPLICATIONS

This application is a U.S. National Phase application of PCT/US2020/062510 filed Nov. 27, 2020, which claims priority to U.S. Provisional Patent Application No. 62/941,922, filed Nov. 29, 2019, the entireties of which are incorporated herein by reference.

FIELD OF THE DISCLOSURE

The present disclosure is directed to methods of making devices comprising distributed bragg reflectors and the devices themselves.

BACKGROUND

III-nitride nanowire light-emitting diodes (LEDs) and lasers are potential building blocks for future photonic integrated circuits (PICs) and nanophotonic devices as light sources due to their tunable band gap and excellent waveguide properties. Monolithic integration of III-nitride nanowire lasers using heteroepitaxy of III-nitride on Si is a major pathway for integrating efficient light-sources with Si-based electronics for PICs. However, the integration of III-nitride nanowires on Si suffers from poor crystalline quality, low optical mode confinement, and poor modal reflectivity from the bottom interface in vertical-cavity nanowire lasers.

It is known in the art that insertion of an AlN buffer layer on silicon substrates prior to growth of III-nitride films partially improves the crystal quality of the III-nitride films by alleviating the strain and corresponding defect reduction in the III-nitride films. In addition, transferring the grown nanowires to a secondary substrate has been used to enhance the modal reflectivity in nanowire cavities. Likewise, dielectric distributed Bragg reflectors (DBRs) have been inserted on the top and bottom of nanowires grown by epitaxy methods to enhance the modal reflectivity in the cavity [Heo, Junseok, et al. Nano letters 13.6 (2013): 2376-2380], [Huang, Jian, et al. Applied Physics Letters 104.13 (2014): 131107.] However, none of the aforementioned methods for improving light emission properties of the nanowire lasers propose a scalable method for integration of III-nitride nanowire lasers on Si.

SUMMARY

An embodiment of the present disclosure is directed to a method for making a device. The method comprises forming a buffer layer on a silicon substrate; forming a periodically doped layer on the buffer layer; forming one or more nanowires on the periodically doped layer; and introducing porosity into the periodically doped layer to form a porous distributed Bragg reflector (DBR).

Another embodiment of the present disclosure is directed to a device. The device comprises a buffer layer on a silicon substrate; a distributed Bragg reflector (DBR) on the buffer layer, the DBR comprising a periodically doped layer comprising alternating doped and undoped layers, the doped layers being porous; and one or more nanowires on the DBR.

Yet another embodiment of the present disclosure is directed to a method for making a device. The method comprises forming a buffer layer on a substrate; forming a periodically doped layer on the buffer layer; forming one or more wires on the periodically doped layer, the wires being chosen from nanowires and microwires; and introducing porosity into the periodically doped layer to form a porous distributed Bragg reflector (DBR).

Still another embodiment of the present disclosure is directed to a device. The device comprises a buffer layer on a substrate; a distributed Bragg reflector (DBR) on the buffer layer, the DBR comprising a periodically doped layer comprising alternating doped and undoped layers, the doped layers being porous; and one or more wires on the DBR, the wires being chosen from nanowires and microwires.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

FIGS. 2A to 2C show a process of making metal-embedded DBR nanowire lasers, according to an embodiment of the present disclosure.

FIG. 3 shows a metal-semiconductor layer formed by penetration of the metal into the porous semiconductor DBR layer upon annealing, according to an embodiment of the present disclosure.

Figure 1A:
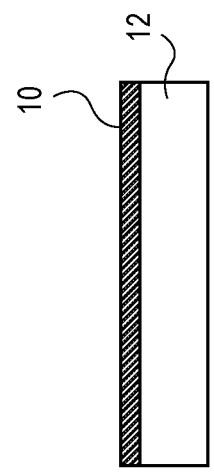
FIGS. 1A to 1F show a top-down fabrication process of nanowire lasers with nanoporous semiconductor DBR, according to an embodiment of the present disclosure.

It should be noted that some details of the figures have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific exemplary embodiments in which the present teachings may be practiced. The following description is, therefore, merely exemplary.

The present disclosure is directed to a scalable and practical method of fabricating low-threshold nanowire devices, such as lasers or LEDs, that emit or transmit light using nano/mesoporous semiconductor DBRs. The methods and/or devices of the present disclosure can provide at least one advantage chosen from: (i) providing tunable lattice-matched DBRs; (ii) alleviating stress in the layers on Si and consequently reducing defects, (iii) enhancing modal reflectivity in a nanowire cavity and (iv) improving optical confinement of the guided mode in the nanowire cavity.

An embodiment of the present disclosure is directed to a method for making a device. As will be described in greater detail below with respect to FIGS. 1A to 1F, the method comprises forming a buffer layer 10 on a substrate 12. A periodically doped layer 14 comprising a ternary alloy is formed on the buffer layer 10. One or more nanowires 20 are formed on the periodically doped layer 14. Porosity is introduced into the periodically doped layer 14 to form a porous distributed Bragg reflector (DBR) 24.

Any suitable substrate 12 can be employed. In an example, the substrate is a silicon substrate. One of ordinary skill in the art would be able to determine various other suitable substrates that can also be employed. Examples of other suitable substrate materials include GaN, InGaN, AlGaN, AlN, SiC, GaAs, and sapphire ($Al_2O_3$). The substrates can have various crystal orientations. For example, a GaN substrate can have C-plane orientation, m-Plane orientation or a semipolar plane orientation. Substrates comprising one or more of any of the above substrate materials can be employed.

Any suitable buffer layer 10 can be employed. In an example, the buffer layer is aluminum nitride (AlN). One of ordinary skill in the art would be able to determine a suitable buffer layer material. Examples of other suitable buffer layer materials include AlGaN or AlInGaN. Buffer layers comprising one or more of any of the buffer layer materials described herein can be employed.

Figure 1B:
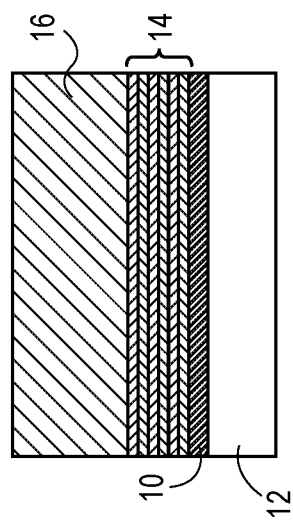
Figure 1C:
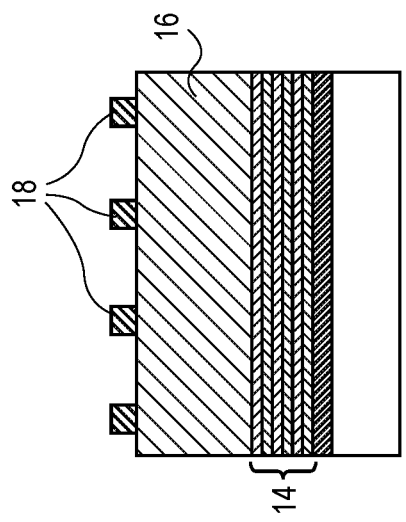

Referring to FIG. 1B, the periodically doped layer 14 is formed by depositing a first blanket layer by epitaxial growth. The periodically doped layer 14 comprises, for example, a ternary alloy such as AlGaN or any of the other materials described herein for use as the periodically doped layer. The periodically doped layer 14 comprises one or more pairs of doped and undoped layers, which are referred to herein as DBR layer pairs. Each DBR layer pair includes a doped layer 24A and an undoped layer 24B (FIG. 3). Thus, the DBR 24 of FIG. 3 comprises a single DBR layer pair, while FIG. 6I shows DBR 24 comprising two DBR layer pairs. The same material can be employed for all doped and undoped layers of the periodically doped layer 14, the only difference in material between the doped and undoped layers being the dopant concentration in the doped layers. The material used for the periodically doped layer 14 will depend on the type of gain material used for the nanowires 20, among other things. The material used for the periodically doped layer will generally be different than the gain material, although the materials may have reasonably close lattice constants. As an example, if the material used to make the nanowires 20 is GaN then the ternary alloy for the periodically doped layer 14 used to form the DBR can be, for example, $Al_xGa_{1-x}N$, which is periodically doped with silicon (Si). In an embodiment, the values for X can be any values that result in a ternary compound of AlGaN, such as values ranging from about 0.05 to about 0.95, or about 0.1 to about 0.15. In yet other embodiments, X can range from 0 to 1, so as to include GaN and AlN. The dopant concentration in the doped layers can range, for example, from about $1\times10^{16}$ to about $1\times10^{19}$ or $1\times10^{20}$ cm$^{-3}$, such as $5\times10^{19}$ cm$^{-3}$. Examples of other suitable periodically doped layer materials include InGaN, AlInN and AlInGaN. Periodically doped layers comprising one or more of any of the materials described in the present disclosure for use as a periodically doped layer can be employed. The type of material employed for the periodically doped layer will depend on the gain material employed. In an embodiment, the gain material can comprise $In_xG_{1-x}N$ and the DBRs can comprise GaN. The dopants employed for any of the periodically doped layer materials described herein can be n-type dopants, such as silicon (Si) or germanium (Ge).

The doping changes the chemical reactivity, so that when etched the periodically doped layers become porous compared to undoped layers, which remain solid. The greater the dopant concentration, the more porous the doped layers become after etching. Using electrochemical etching, as described below, the doped layers are selectively etched to become porous while the undoped layers are not etched. Example porosity in the doped layers after etching can range from about 20% void to 80% void, such as about 30% void to 80% void, based on the total volume of the doped layer. The porosity can be adjusted according to the desire refractive index for each layer.

The porosity in the doped layers reduces the effective refractive index relative to the effective refractive index of the undoped, non porous layers of the DBR. The porosity of the periodically doped layer can be tuned by varying the dopant concentration, thereby allowing tuning of the effective refractive index of the DBR layers. The porosity may also be tuned by changing the applied voltage bias during the electrochemical etch. The effective refractive index takes into account the effect on refractive index of the voids, or pores, in the layers. Assuming the pores are filled with air, they generally have a refractive index of about 1, which will be lower than the refractive index of the doped or undoped semiconductor material that makes up the remainder of the DBR. Thus, due to the pores in the doped layers of the DBR, the doped layers will have a significantly lower effective refractive index than the undoped layers in the DBR, which are non-porous or substantially non-porous compared to the doped layers. By tuning the porosity of the doped layers, the effective refractive index of the doped DBR layers can in turn be tuned in order to increase the reflectivity of the DBR.

The wavelength of peak reflectance for the DBR can also be tuned by varying the thickness of the DBR layers. A desired thickness of each layer of a DBR layer pair can be calculated using a quarter-wavelength equation, so that the thickness, $t_1$, of DBR layer 24A and the thickness, $t_2$, of DBR layer 24B (FIG. 3) is each equal to ($\lambda/4n_{eff}$), where $\lambda$ and $n_{eff}$ are the wavelength of light to be propagated in the nanowires 20 and the effective refractive index of the material used for the corresponding DBR layers, respectively. Use of the quarter wavelength equation to calculate layer thicknesses for DBRs is generally well known in the art. A single DBR layer pair ($t_1+t_2$) can have a thickness ranging, for example, from about 2 nm to about 150 nm, such as about 5 nm to about 100 nm.

By increasing the number of doped/undoped pairs it is possible to increase reflectivity of the resulting DBR. The number of DBR layer pairs can be chosen based on the desired reflection and length of the nanowire cavity and can range, for example, from 1 to 20 DBR layer pairs, such as 2 to about 8, or 3 to about 5. The number of DBR layer pairs can be outside of these ranges. For example, the number of DBR layer pairs can range as high as 30 or 40 or more. The composition and total thickness of the periodically doped layer 14 can be also be tuned to reduce the stress in a subsequently formed blanket layer of gain material (e.g., a GaN film) and to minimize defect generation and crack formation during epitaxial growth cool down process.

Referring again to FIGS. 1B to 1E, one or more nanowires 20 are formed. In an embodiment, a method for forming the one or more nanowires 20 comprises depositing a gain layer 16 comprising a blanket deposited gain material on the periodically doped layer 14 and then etching the gain layer 16 prior to etching the periodically doped layer 14. The gain material from which the gain layers 16 are made can comprise a Group III-V semiconductor. For example, the Group III-V semiconductor can be a Group III-N material such as GaN. Examples of other Group III-V and Group III-N gain materials include $Al_xGa_{1-x}N$, $In_xGa_{1-x}N$, GaAs and AlGaAs, where the values for X can be any values that result in a ternary compound of AlGaN, such as values ranging from about 0.05 to about 0.95. In yet other embodiments, X can range from 0 to 1 so as to include GaN, AlN and InN. The gain section can comprise multiple materials and/or layers from the AlInGaN family. In an example, the gain layer 16 can comprise one or a plurality of layers, including any of the gain layer materials described herein, and may include, for example, a quantum well active region, as would be understood by one of ordinary skill in the art.

MOCVD growth or other epitaxial growth processes can be employed for forming the buffer layer 10, periodically doped layer 14 and gain layer 16 structure of FIG. 1B. The growth on Si (e.g. silicon substrate 12) can be initiated by growing the buffer layer 10 followed by a thicker layer of alternating Si-doped and unintentionally-doped ternary alloy, or any of the other materials described herein for forming the periodically doped layer 14. Gain layer 16 comprises one or both of an unintentionally doped material and an n-type material (e.g., completely unintentionally doped, completely n-doped or including both portions that are n-doped and unintentionally doped). Often gain layer 16 will be mostly or completely unintentionally doped. The terms unintentionally doped and undoped as used herein have the same meaning. One of ordinary skill in the art would readily understand that undoped layers, or layers that are not intentionally doped, may include trace amounts of contaminants that may or may not act as dopants. It would be further understood that the doped layers will have significantly higher dopant concentration than the unintentionally doped (undoped) layers.

Figure 1D:
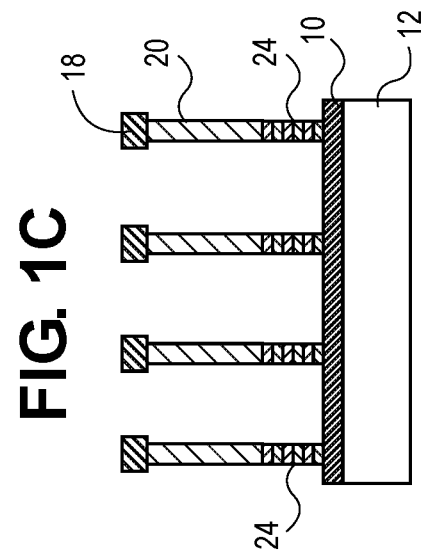
Figure 1E:
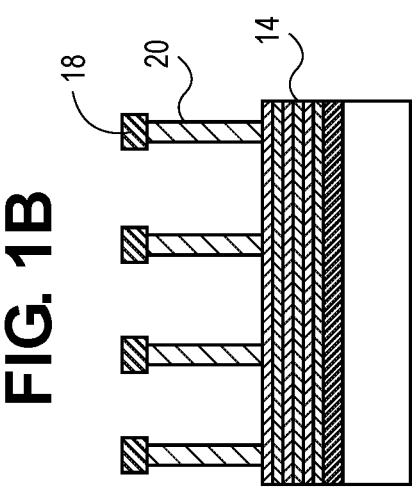

In an embodiment, a top-down approach is used to form the nanowires 20 using, for example, e-beam lithography or interferometric lithography [M. Behzadirad et al, ACS Nano, 12, 3 (2018)] or other suitable patterning technique. As an example, a metallic mask 18 is made on the planar films through a metallization and then patterning process (e.g., lift-off process or other photolithographic patterning process). Metallic mask 18 can comprise, for example, nickel or any other suitable metal. After forming the metallic mask 18, an inductively-coupled plasma (ICP) system is used to etch the gain layer 16 into a circularly patterned film. The etching process can comprise a dry etch that stops at the top of the periodically doped layer 14 to form the nanowires 20, as shown in FIG. 1D. The dry etch is stopped at the top of the periodically doped layer 14 (which will be turned into the DBR) to protect periodically doped layer 14 from a subsequent KOH-based wet-etch process during fabrication of the nanowires. The wet-etch process can then be used to smooth the nanowire sidewalls, as shown in FIG. 1E. As would be understood by one of ordinary skill in the art, the wet etch chemistry can be chosen to selectively etch crystallographic planes of the gain material in the way that top-surfaces (c-plane) of nanowire 20 and the periodically doped layer 14 will not be affected by the solution. The resulting nanowires 20 can have a diameter of less than 1 micron, such as about 100 nm to less than 1000 nm, such as about 100 nm to about 950 nm. In an embodiment, microwires are formed instead of nanowires, such as wires having diameters of about 1 micron to about 5 microns, or about 1 micron to about 3 microns. Thus, microwires can be used in place of the nanowires for any of the embodiments disclosed herein.

Figure 1F:
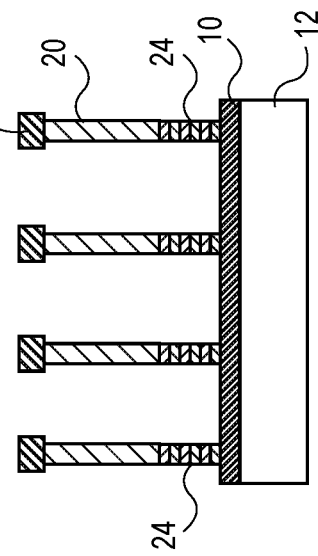

Following etching of the gain layer 16 to form nanowires 20, a second dry etch is carried out to etch the periodically doped layer 14 down to the Si substrate. The second dry etch can be any suitable dry etch, such as an inductively-coupled plasma (ICP) etch process as discussed above, that is carried out while the gain material is protected by the initial metallic mask 18. As shown in FIG. 1F, the periodically doped layer 14 will then be turned into the DBR 24 using a second wet etch. The second wet etch is carried out by an electrochemical (EC) nano-porosification etching process that employs an acid solution (e.g., either Oxalic Acid or Nitric Acid). Any other suitable etch chemistries can also be used, such as, for example, a basic solution (e.g., KOH) etch. During the EC etching process, the doped layers of the periodically doped layer 14 are selectively etched and become porous in the acid solution. More detailed descriptions of the EC etching process are discussed in the inventors' earlier works, e.g., S Mishkat-Ul-Masabih et al, Applied Physics Letters, 112, 4 (2018).

The nanowire 20 can be employed for light propagation in a nanowire laser or other device, and may sometimes be referred to herein as a nanowire cavity, laser cavity or a cavity. Scattering and mode expansion out of the nanowire cavity is a main concern in nanowire laser structures with sub-wavelength dimensions, which are responsible for low modal reflectivity and high threshold in coherent light emitter devices. Moreover, the incident light mode highly expands in the DBR layers with lower refractive indices compared to the gain medium, which drops the overall reflected portion of the mode and reduces the modal reflectivity.

Referring to FIGS. 2A to 2C, a metal layer 28 can be deposited adjacent to the DBR 24 to form metal side reflectors and increase mode confinement and consequently improve modal reflectivity. The choice of metal for metal layer 28 depends on the wavelength of the propagating mode inside the cavity in which the minimum refractive index and extinction coefficient are always preferred. Silver or aluminum are some examples of metals that can be used for UV wavelengths. The metal layer 28 assists optical mode confinement by reducing the refractive index of the surrounding medium and enhancing side reflection within the DBR 24. Preliminary simulation results indicate that using the metal side reflectors, only a few DBR layer pairs (e.g., 1-2 pairs) are sufficient to obtain reflectance above 50%. This structure can be obtained by a metal deposition step following formation of DBRs 24 in FIG. 1F, as shown in FIGS. 2A to 2C.

After depositing metal layer 28 on the sidewalls of the DBR 24, the metallic mask 18 can be removed by etching, as shown in FIG. 2C. Any etching techniques for removing the metallic mask 18 can be employed. Additionally, the metal layer 28 can optionally be annealed to obtain even higher reflectivity with fewer number of DBR layer pairs in the DBR 24. The annealed metal can penetrate into the pores and make a metal-semiconductor composite which increases the overall modal reflectivity at the bottom interface. Whether annealing occurs or not, the metal layer 28 can optionally be removed between the DBRs 24 and a desired amount of metal can remain in the pores so as to increase reflectivity. FIG. 3 illustrates a DBR 24 having a single DBR layer pair comprising a metal-semiconductor porous layer 24A, where the metal layer 28 adjacent the DBR 24 has been removed.

Figure 4C:
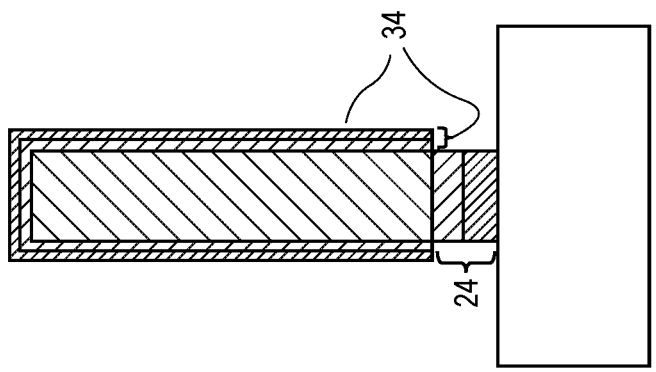
FIGS. 4A to 4C show a method of making porous semiconductor DBRs on the bottom and side wall of nanowire lasers, according to an embodiment of the present disclosure.
Figure 4B:
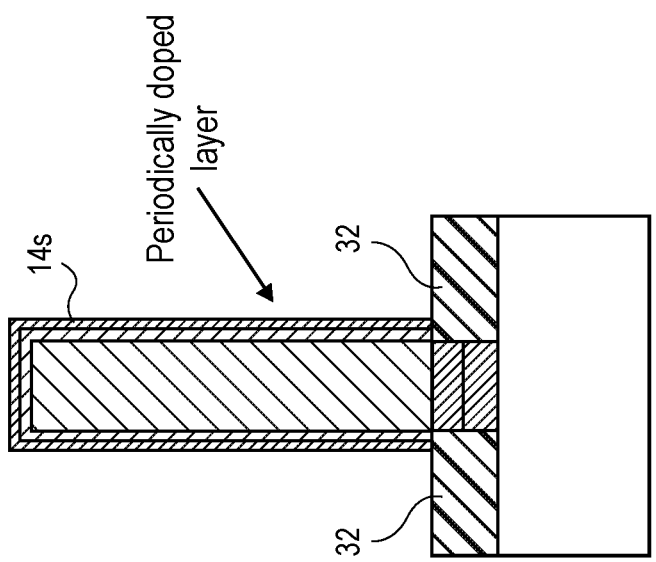
Figure 4A:
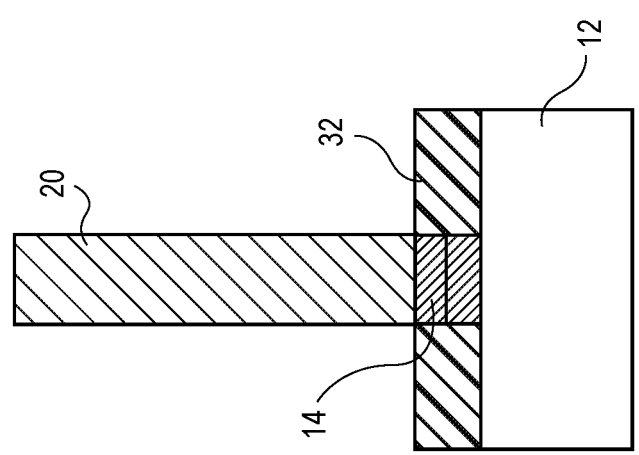

To further confine the optical mode inside the nanowire gain medium during propagation, sidewall DBRs 34 can be radially grown on the sidewalls of the nanowires, as shown in FIGS. 4A to 4C. Further confinement can be useful, for example, in situations where the wavelength of the propagating light is larger than the cavity diameter (e.g., diameter of the AlGaN portion) of the one or more nanowires 20. The regrowth is conducted after the high-aspect-ratio gain layers 16 are fabricated on top of the periodically doped layer 14 (e.g., after the first wet etch in FIG. 1E or following the second dry etch and prior to the wet etch to introduce porosity in FIG. 1F) followed by a dielectric layer deposition and metal lift-off process to form dielectric layer 32. Similar periodically doped sidewall layers 14s, comprising for example ternary alloy, as are used for forming the bottom DBR 24 can also be deposited for forming sidewall DBRs 34. Porosities can be initially introduced into the periodically doped layers 14s on the sidewalls to form DBR 34 while periodically doped layers 14 are still protected by dielectric layer 32 (FIG. 4B), and then a short time etching process can be used to introduce porosities into the periodically doped layers 14 after removing dielectric 32 to form DBR 24. FIG. 4C demonstrates the resulting structure. The number of the DBR layer pairs radially grown on the sidewalls to form DBR 34 can be less than the number of the DBR layer pairs included in the DBR 24, so that the device performs as a top surface emitter. A metal layer 28, as described above with respect to FIGS. 2 and 3, can be employed with this structure to make metalized porous layers in one or both of the DBR 24 and sidewall DBR 34. In an alternative process, instead of forming sidewall DBRs 34, a second DBR 24 can be added only at the top of the nanowires 20 of FIG. 1F after removing metallic mask 18. The resulting structure (not shown) has a DBR 24 positioned at each end of the nanowire 20.

Figure 5A:
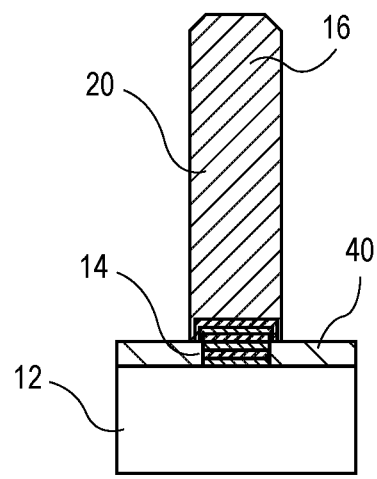
FIGS. 5A to 5D show nanoporous semiconductor DBRs in bottom-up nanowires, according to embodiments of the present disclosure.
Figure 5B:
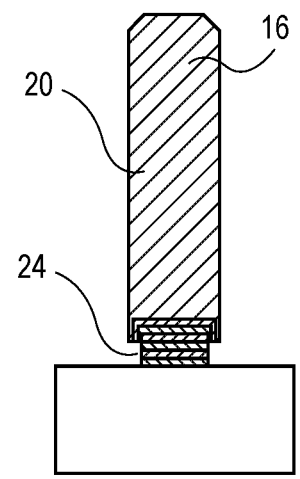
Figure 5C:
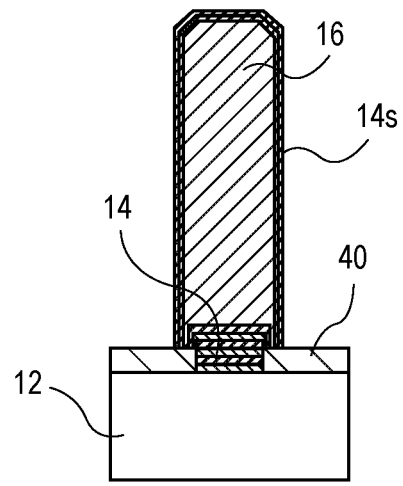

Porous DBRs can also be incorporated with grown nanowires on a silicon substrate using a bottom up process. In this process, a silicon substrate 12 (e.g., a silicon wafer) is pattern by dielectric mask layer 40 having a chosen thickness (FIG. 5A). Then buffer layer 10 and a periodically doped layer 14 are selectively grown on the patterned substrate 12 followed by selectively growing a gain layer 16. The gain layer 16 can comprise one or a plurality of layers, which may include, for example, a quantum well active region, as would be understood by one of ordinary skill in the art. Sidewall DBRs can be added either using dielectric materials, using methods known in the art, or porous semiconductor materials, such as electrochemically etched periodically doped ternary alloys (e.g., $Al_xGa_{1-x}N$). The doped regions in the periodically doped layers 14,14s can be available for etching by the electrochemical solution through defects, cracks and the side of the grown periodically doped layer 14,14s. FIG. 5A to 5B show a nanowire grown in a bottom-up approach, where FIG. 5A shows the structure before an electrochemical etch and FIG. 5B shows the structure after an electrochemical etch of periodically doped layer 14. The same method as discussed above can be used for making sidewall DBRs 34 as is shown in FIG. 5C to 5D, where FIG. 5C shows the structure before an electrochemical etch and FIG. 5D shows the structure after an electrochemical etch.

The devices, e.g., lasers or LED structures, of the present disclosure can be optically pumped or electrically pumped. A bottom-up approach for an electrically pumped nanowire laser with nanoporous DBRs is shown in FIGS. 6A to 6F. In this structure, a silicon substrate 12 is patterned with a dielectric mask layer 40, such as in the manner set forth above in the description of FIG. 5. A periodically doped layer 14 and a layer 16 are initially selectively grown on the patterned silicon substrate 12. It is noted that for the electrically pumped device of FIG. 6, layer 16 is not technically a gain medium or gain layer, so when referring to FIG. 6, layer 16 is referred to merely as layer 16. However, all of the materials employed for the gain layers 16 of, for example, FIGS. 1 to 5, as described herein can also be employed for the layer 16 of FIG. 6. Layer 16 comprises one or both of an unintentionally doped material and an n-type material (e.g., completely unintentionally doped, completely n-doped or both portions that are n-doped and unintentionally doped). As shown in FIG. 6C, the layer 16 forms a nanowire 20 during selective growth. The periodically doped layer 14 can comprise any of the materials described herein for use in such layers, such as the ternary alloy materials described herein. Any of the gain materials described herein can be doped with an n-type dopant and employed to form layer 16, although other dopant configurations can be employed (e.g., a p-type or unintentionally doped layer 16) as described below. The dielectric mask layer 40 is removed and the structure is immersed into a EC solution to introduce porosities into the periodically doped layer 14, as shown in FIG. 6C, thereby forming a DBR 24. A thick dielectric layer 42 is deposited to cover DBR 24 and n-type nanowire sidewalls. A chemical-mechanical polishing can be used to remove a portion of dielectric layer 42 from the top of the n-type nanowire 20 following by quick dip into a diluted HF solution to remove dielectric from a top portion of sidewall 44 of the nanowire 20, as shown in FIG. 6D. Then active region 46, including quantum wells and p-type layer 48 are grown on top of the n-type nanowire 20 as shown in FIG. 6E. In an alternative example, the layer 16 can be p-doped and the layer 48 can be n-doped. A transparent ITO p-contact 50 and a metal deposition for n-contact 52 can be used to electrically bias nanowire 20, as shown in FIG. 6F. In an embodiment, contact 50 can entirely cover the p-type layer 48.

The present disclosure is also directed to a device as shown in FIG. 1F. The device comprises a buffer layer 10 on a silicon substrate 12. A distributed Bragg reflector (DBR) 24 is on the buffer layer 10. The DBR 24 comprises a periodically doped layer comprising alternating doped and undoped layers, the doped layers being porous. Thus, the DBR 24 includes alternating porous layers (doped layers) and non-porous layers (undoped layers), where the porosity in the doped layers can be formed by selectively electrochemically etching the doped regions of the periodically doped layer 14 as described herein. Nanowires 20 comprising gain material are disposed on the DBR 24. The buffer layer 10 comprises any of the materials described herein for use in a buffer layer, such as AlN. The one or more nanowires 20 comprise any material described herein for use as a gain layer or nanowire, such as a Group III-V semiconductor (e.g., GaN or InGaN). The alternating porous and non-porous layers comprise, for example, a periodically doped ternary alloy, such as, for example, $Al_xGa_{1-x}N$, or other III-V material such as GaN, or any other materials described herein for use as a periodically doped layer that have close lattice constant to the gain material. In an embodiment as shown and described above for FIG. 2C, the DBR 24 comprises sidewalls and a metal layer 28 is on the sidewalls. In an embodiment, the one or more nanowires 20 comprise a Group III-nitride, such as GaN or any of the other III-V materials described herein for use in the gain layer or nanowires.

Figure 5D:
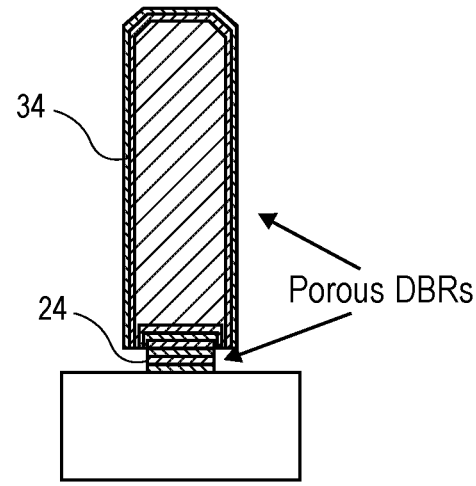
Figure 6C:
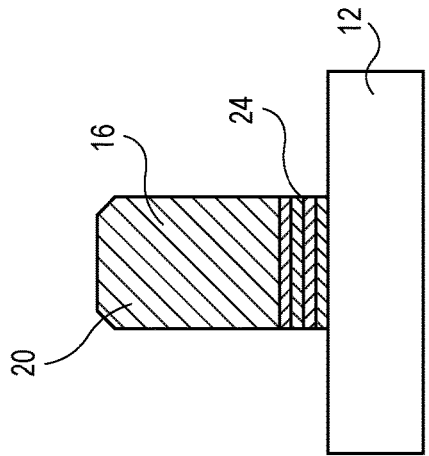
FIGS. 6A to 6F show a method of making electrically pumped nanowire lasers through a bottom-up approach, according to an embodiment of the present disclosure.
Figure 6B:
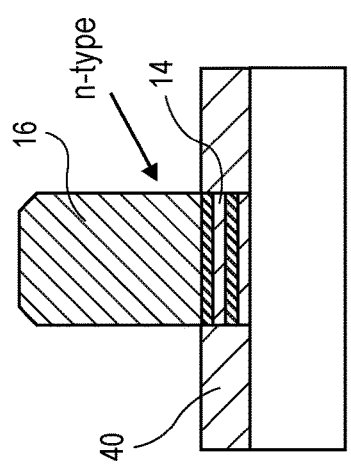
Figure 6A:
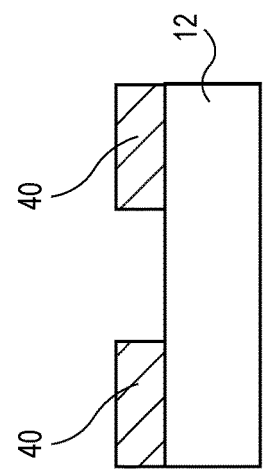
Figure 6F:
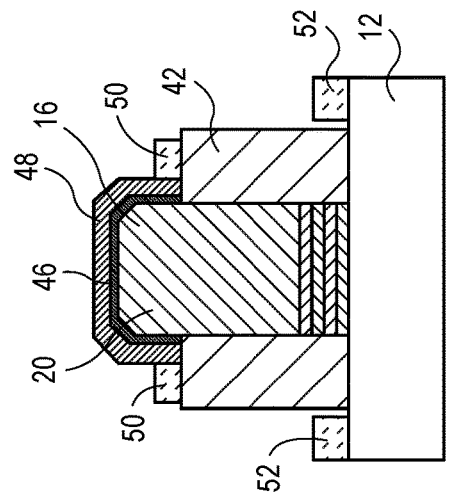
Figure 6E:
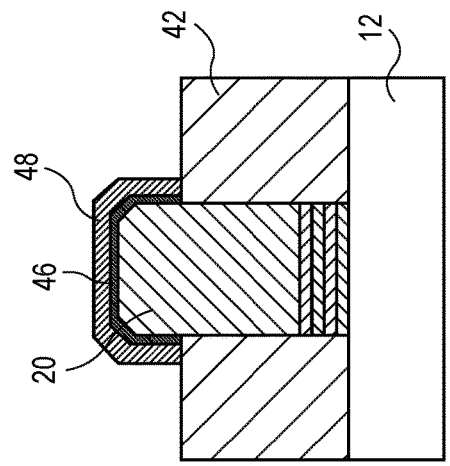
Figure 6D:
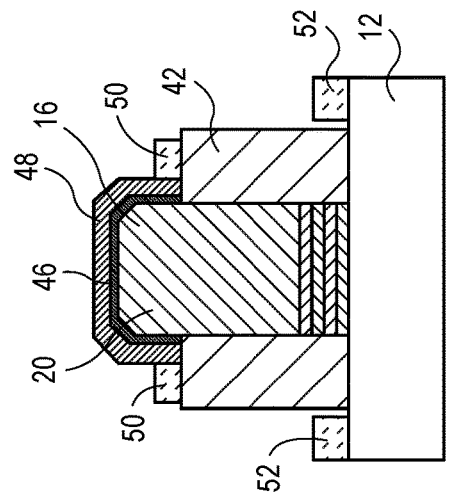

In an embodiment, the devices further comprise a second distributed Bragg reflector (DBR) 34 on exposed sides of the nanowire, such as shown in FIGS. 4C and 5D. The sidewall DBR 34 comprises one or more pairs of alternating porous and non-porous layers. In an embodiment as shown in FIG. 6F, the device further comprises an active region 46 comprising one or more quantum wells on the nanowire. While the layer 16 for FIG. 6 is generally described as n-doped, the dopant configuration for the layer 16 can vary depending on device design and the desired electrical characteristics. Thus, the layer 16 can comprise unintentionally doped (undoped) material, n-type and/or p type material and a layer 48 can be either doped opposite to the layer 16 (e.g., an n-type layer 16 and a p-type layer 48, or vice versa) in the case where the layer 16 comprises dopant, or if the layer 16 is unintentionally doped then layer 48 can be doped, such as with p-type dopant. One of ordinary skill in the art would be able to determine how to dope the layers to provide the desired device characteristics.

The devices are not limited to lasers, and can be any devices that would benefit from the DBRs of the present disclosure. In an example, the devices including the nanoporous DBRs as described herein are light-emitting diodes (LEDs), or high-aspect-ratio III-nitride nanowire cavity emitters with sub-wavelength diameter grown on silicon substrates. Any of the devices of the present disclosure can be made by any suitable methods and are not necessarily made by the methods described herein.

Figure 8:
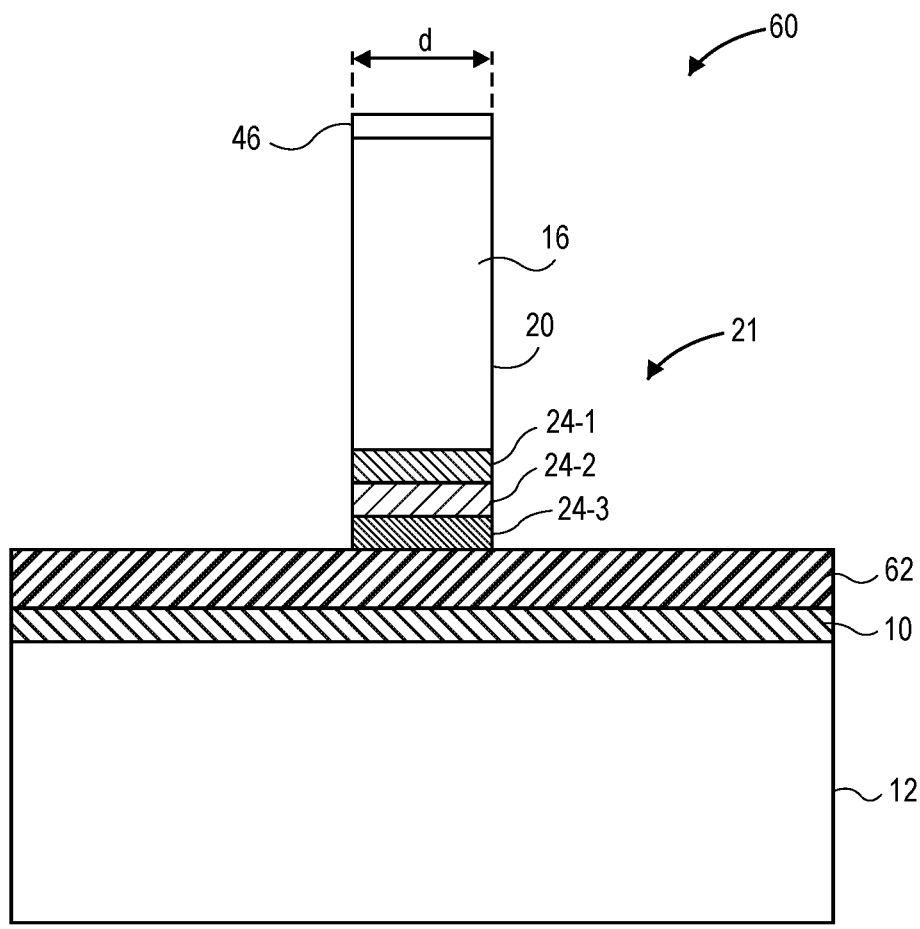
FIG. 8 illustrates a single light emitting diode (LED) or other device comprising nanoporous DBRs, according to an embodiment of the present disclosure.

FIG. 8 illustrates a single light emitting diode (LED) 60 comprising nanoporous DBRs 24-1, 24-2 and 24-3 and nanowire 20, which together form an integrated wire-DBR structure 21. In an embodiment, the nanowire 20 can be a wire that is larger than nanosize, such as a microwire. In an example, the diameter, d, of wire 20 may range from about 100 nm to 5 um, such as about 100 nm to less than 1000 nm, such as about 1 micron to about 3 microns.

In an example, Nanoporous DBRs 24-1, 24-2 and 24-3 can each reflect a different range of wavelengths of light. For instance, 24-1 can reflect light with a peak wavelength in the blue spectrum, 24-2 can reflect light with a peak wavelength in the green spectrum and 24-3 can reflect light with a peak wavelength in the red spectrum. Using Nanoporous DBRs having different peak reflectances can be useful, for example, for reflecting white light from a white light emitting nanowire 20. In an embodiment, one or more DBRs 24 can be employed that have the same or different peak reflectance. For example, the nanoporous DBRs can comprise one, two, or three DBRs reflecting in the blue, green, and/or red regions. As an example, the peak reflectance of the DBRs is designed to occur at red (e.g., 630 nm), green (e.g., 530 nm), and blue (e.g., 460 nm). The nanoporous DBRs can be made, for example, by depositing a periodically doped layer on the buffer layer 10. Porosity is then introduced into the periodically doped layer by etching to form a porous distributed Bragg reflector (DBR) 24, as described herein above. The periodically doped layer and the resulting DBR layers can be, for example, one or more materials chosen from $Al_xGa_{1-x}N$, $In_xGa_{1-x}N$, AlInGaN, GaN, AlN, InN, $Al_xGa_{1-x}As$, $In_xGa_{1-x}As$, AlInGaAs, GaAs, InGaAs, InAs and AlGaAs, where X ranges from 0 to 1, such as about 0.05 to about 0.95.

The nanowire 20 can be designed for generating white light, or any other desired color of light. Any of the materials described herein for use as nanowires, such as gain materials listed herein, can be employed for the nanowire 20, such as, for example one or more materials chosen from $Al_xGa_{1-x}N$, $In_xGa_{1-x}N$, AlInGaN, GaN, AlN, InN, $Al_xGa_{1-x}As$, $In_xGa_{1-x}As$, AlInGaAs, GaAs, InGaAs, InAs and AlGaAs, where X ranges from 0 to 1, such as about 0.05 to about 0.95. The nanowire 20 can comprise one or a plurality of layers, which may include, for example, one or more layers 16 (such as described herein with respect to FIG. 1 or 6) and optionally one or more quantum well active regions 46 similar as described herein above with respect to FIG. 6F. In an embodiment, where nanowire 20 is made to generate white light (e.g., a white LED), nanowire 20 can comprise either: i) triple active regions for emitting in red, green, and blue, which together function to emit a white spectrum, or ii) a violet or blue active region combined with an overlying phosphor to convert the violet or blue light to a white spectrum. Such active regions for generating white spectrum light are known in the art. In an embodiment, where nanowire 20 is a white light generating region (which is effectively a white LED), the nanowire 20 can include a pn diode comprised of n-type GaN, an InGaN/GaN active region, and p-type GaN. Any materials from the family AlInGaN (e.g., GaN, $In_xGa_{1-x}N$, $Al_xGa_{1-x}N$) may be employed in the nanowire 20 (e.g., as gain layers, active regions or other layers), where ranges for X can be any of the ranges described herein for X (e.g., 0 to 1).

The nanoporous DBRs are disposed on an unintentionally doped (UID) or n-type doped GaN layer 62, which in turn is disposed on a buffer layer 10 and substrate 12. The purpose of layer 62 is to improve material quality (e.g., provide better surface morphology and reduced threading dislocation density) after the growth of the buffer layer 10. Layer 62 can have a thickness of 1-2 um or any thickness outside this range that results in a better surface morphology or lower dislocation density. Layer 62 is optional and in an embodiment is not present. The buffer layer 10 can comprise any of the materials disclosed herein as being useful for a buffer layer. Substrate 12 can comprise any of the materials disclosed herein as being useful for a substrate.

The LED structure of FIG. 8 may be formed by any of the top-down or bottom-up methods described in the present application, such as methods similar to those described with respect to FIGS. 1A to 1F and 2A to 2C or FIGS. 6A to 6F. For instance, the method can comprise making a device, comprising: forming a buffer layer 10 on a substrate 12; optionally forming an undoped or n-doped GaN layer 62 on the substrate 12; forming a periodically doped layer 14 on either the buffer layer 10 or the GaN layer 62; forming one or more wires on the periodically doped layer, the wires being chosen from nanowires 20 and microwires; and introducing porosity into the periodically doped layer to form one or more porous distributed Bragg reflectors (DBRs) 24 (e.g., 24-1, 24-2, 24-3).

Figure 9:
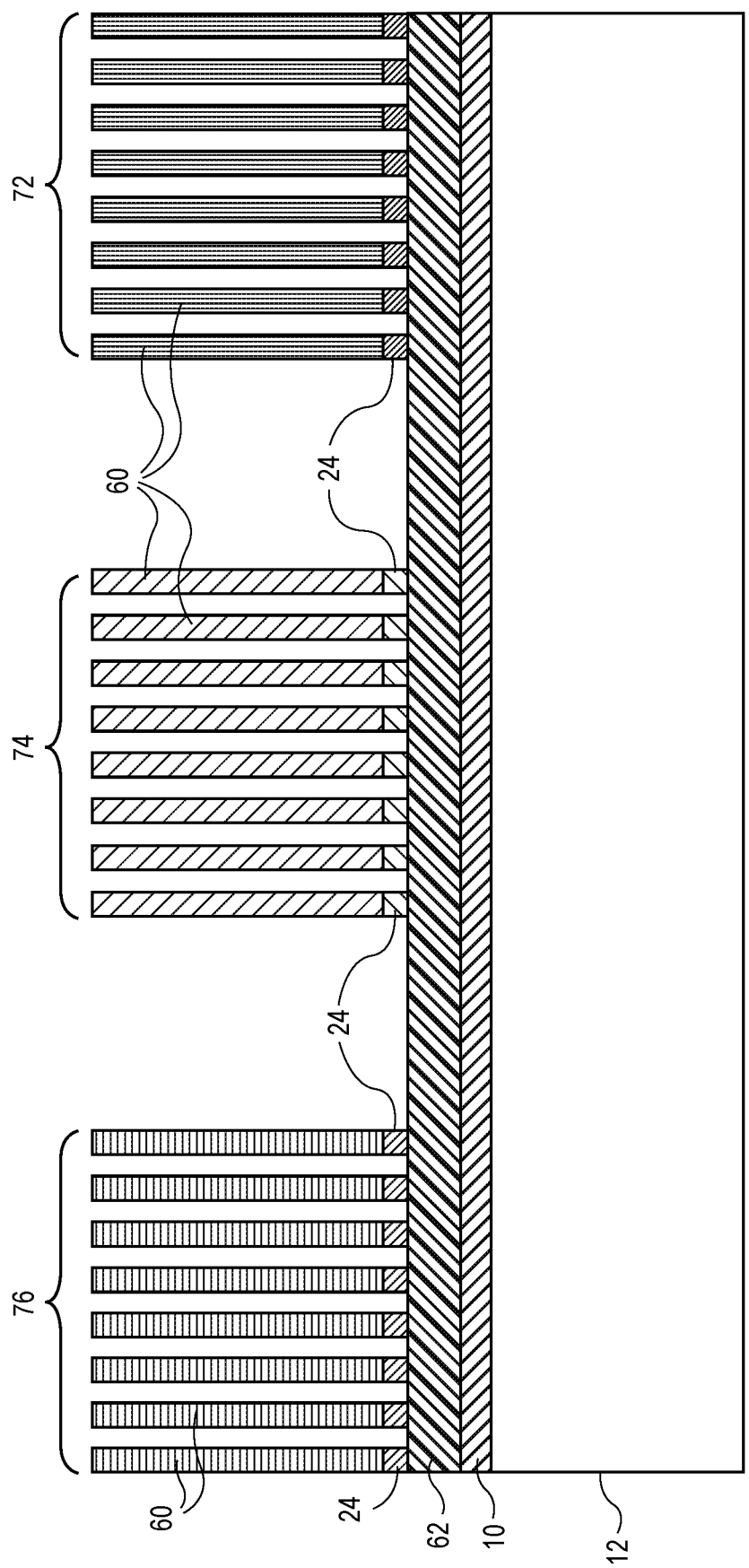
FIG. 9 shows a plurality of LEDs arrayed to form multiple LED arrays on a single chip, according to an embodiment of the present disclosure.

A plurality of LEDs similar to the LEDs 60 of FIG. 8 can be configured to form multiple LED arrays on a single chip 70. For example, arrays of red pixels 72, green pixels 74, and/or blue (RGB) pixels 76 may be formed using red, green, and blue LEDs 60, as shown in FIG. 9. Each LED 60 of FIG. 9 can include one or more DBR layer pairs that each have the same or similar peak reflectance (e.g., all the DBRs 24 in the same LED 60 reflect light of the same color, rather than multiple DBR layers 24 having different peak reflectances as shown in FIG. 8). The RGB array can emit white light that is more efficiently reflected away from the substrate 12. Substrate 12 can comprise any of the substrate materials described herein. Buffer layer 10 and undoped or n-doped GaN layer 62 can also respectively be the same as any of the buffer layers or undoped or n-doped GaN layers described herein. The RGB LED layers (e.g., gain layers, nanowires and/or DBR layers) can comprise, for example, materials from the AlInGaN family (e.g., GaN, $In_xGa_{1-x}N$, $Al_xGa_{1-x}N$), where X ranges from 0 to 1, such as 0.05 to 0.95, or any other materials described herein for use as gain layers, nanowires or DBR layers.

The devices of FIGS. 8 and 9 are not limited to LEDs, and can be any devices that would benefit from the DBRs of the present disclosure. In an example, the devices including the nanoporous DBRs as described herein with respect to FIGS. 8 and 9 are lasers. Any of the devices of the present disclosure can be made by any suitable methods and are not necessarily made by the methods described herein.

EXAMPLES

Example 1—Example Dimensions

Figure 7:
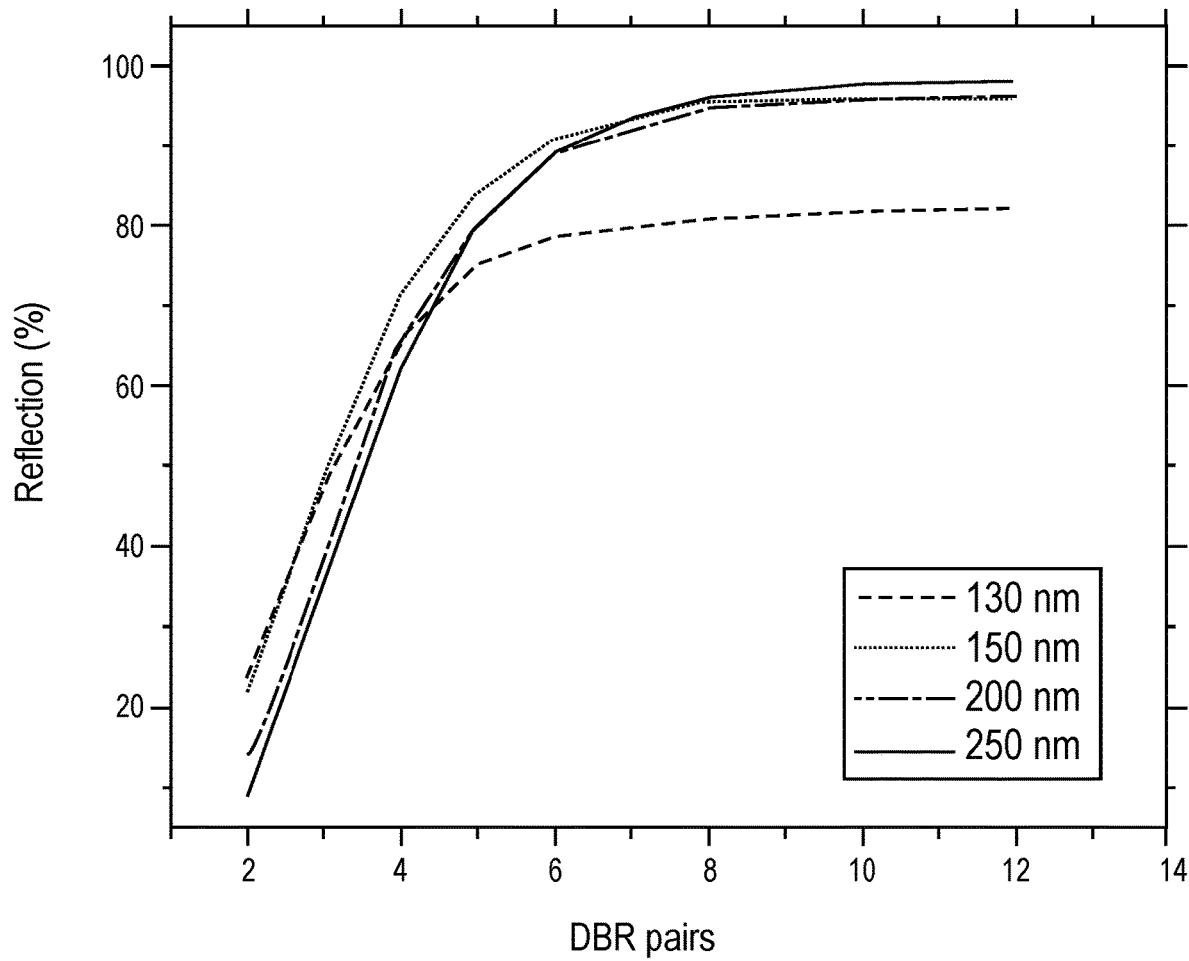
FIG. 7 is a graph of finite-difference time domain modelling data showing how DBRs can enhance modal reflection in a nanowire laser cavity, according to an example of the present disclosure.

For a given nanowire diameter (200 nm) and Aluminum composition in AlGaN layer (10%-13%), the following thicknesses and refractive indices for the porous layer (doped layer) and nonporous layer (undoped layer) of a DBR were determined to provide a desired degree of reflection for 365 nm wavelength:

Effective refractive index of nonporous layer (undoped layer): 2.4-2.5
Effective refractive index of porous layer (doped layer): 1.6-1.9
Thickness of nonporous layer (undoped layer): 36.5 nm-38 nm
Thickness of porous layer (doped layer): 48 nm-57 nm Example 2—Modelling Date Showing Effect of Number of DBRs on Reflection Enhancement Using a finite-difference time-domain (FDTD) simulation carried out using LUMERICAL™ modelling software, a nanowire laser structure with nanoporous DBRs was modeled to predict how including DBRs will enhance the modal reflection in the nanowire cavities. For a given optical wavelength 365 nm, the refractive indices of planar GaN, AlGaN (with ~10%-13% Al), and AlN are ~2.8, ~2.6, and ~2.16. Using the mode solver module in the Lumerical software, the effective refractive indices ($n_{eff}$) for fundamental $HE_{11}$ mode were obtained for different nanowired diameters at each layer and used as the input values in the FDTD modeling. The thickness of each layer in DBR structure was adjusted based on the quarter wavelength equation ($\lambda/4n_{eff}$). FIG. 7 shows the reflection enhancement from the bottom interface as a function of DBR pairs in nanowire cavities with different diameters (130 nm, 150 nm, 200 nm, 250 nm).

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method for making a device, comprising:
   forming a buffer layer on a silicon substrate;
   forming a periodically doped layer on the buffer layer;
   forming one or more nanowires on the periodically doped layer; and
   introducing porosity into the periodically doped layer to form a porous distributed Bragg reflector (DBR).

2. The method of claim 1, wherein the buffer layer comprises AlN.

3. The method of claim 1, wherein the one or more nanowires comprise a Group III-V semiconductor.

4. The method of claim 3, wherein the Group III-V semiconductor is GaN.

5. The method of claim 1, wherein forming the periodically doped layer comprises depositing a first blanket layer comprising a ternary alloy and then etching the first blanket layer.

6. The method of claim 5, wherein forming the one or more nanowires comprises depositing a second blanket layer comprising a gain material on the first blanket layer and then etching the second blanket layer prior to etching the first blanket layer.

7. The method of claim 1, wherein forming the periodically doped layer comprises patterning the substrate and then selectively depositing a patterned layer comprising a ternary alloy.

8. The method of claim 7, wherein forming the one or more nanowires comprises selectively depositing a material on the patterned layer comprising the ternary alloy.

9. The method of claim 1, further comprising forming a second periodically doped layer on exposed sides of the nanowire and introducing porosity into the second periodically doped layer.

10. The method of claim 1, further comprising forming an active region comprising one or more quantum wells on the one or more nanowires.

11. A device, comprising:
a buffer layer on a silicon substrate;
a distributed Bragg reflector (DBR) on the buffer layer, the DBR comprising a periodically doped layer comprising alternating doped and undoped layers, the doped layers being porous; and
one or more nanowires on the DBR.

12. The device of claim 11, wherein the buffer layer comprises AlN.

13. The device of claim 11, wherein the one or more nanowires comprise a Group III-V semiconductor.

14. The device of claim 13, wherein the Group III-V semiconductor is GaN.

15. The device of claim 11, wherein the periodically doped layer comprises a ternary alloy.

16. The device of claim 15, wherein the ternary alloy is $Al_xGa_{1-x}N$.

17. The device of claim 15, wherein the DBR comprises sidewalls and a metal layer is on the sidewalls of the DBR.

18. The device of claim 11, wherein the one or more nanowires comprise a Group III-nitride.

19. The device of claim 11, further comprising a second distributed Bragg reflector (DBR) on exposed sides of the nanowire, the second DBR comprising alternating doped and undoped layers, the doped layers being porous.

20. The device of claim 11, further comprising an active region comprising quantum wells on the nanowire.

21. A method for making a device, comprising:
forming a buffer layer on a substrate;
forming a periodically doped layer on the buffer layer;
forming one or more wires on the periodically doped layer, the wires being chosen from nanowires and microwires; and
introducing porosity into the periodically doped layer to form a porous distributed Bragg reflector (DBR).

22. The method of claim 21, wherein the one or more wires have a diameter ranging from about 100 nanometers to about 5 microns.

23. The method of claim 21, wherein the periodically doped layer comprises at least one material chosen from AlInGaN, AlInGaAs, $Al_xGa_{1-x}N$, $In_xGa_{1-x}N$, $Al_xGa_{1-x}As$ and $In_xGa_{1-x}As$ where X ranges from 0 to 1.

24. The method of claim 21, wherein the device is a white LED and the DBR comprises two or more DBRs with different peak reflectance wavelengths.

25. The method of claim 24, at least one of the two or more DBRs has a peak reflectance wavelengths in one of the blue, green, and red spectrums.

26. The method of claim 21, wherein the one or more wires comprise a material chosen from $Al_xGa_{1-x}N$, $In_xGa_{1-x}N$, AlInGaN, GaN, AlN, InN, $Al_xGa_{1-x}As$, $In_xGa_{1-x}As$, AlInGaAs, GaAs, InGaAs, InAs and AlGaAs, where X ranges from 0 to 1.

* * * * *